US009734968B2

(12) United States Patent
Kobayashi et al.

(10) Patent No.: US 9,734,968 B2
(45) Date of Patent: Aug. 15, 2017

(54) MULTIFUNCTIONAL SELECTION OPERATION SWITCH APPARATUS

(71) Applicant: TOYO DENSO CO., LTD., Minato-ku, Tokyo (JP)

(72) Inventors: Masahito Kobayashi, Tsurugashima (JP); Kazuteru Abe, Tsurugashima (JP)

(73) Assignee: Toyo Denso Co., Ltd., Tokyo (JP)

( * ) Notice: Subject to any disclaimer, the term of this patent is extended or adjusted under 35 U.S.C. 154(b) by 0 days.

(21) Appl. No.: 15/075,430

(22) Filed: Mar. 21, 2016

(65) Prior Publication Data

US 2016/0284495 A1 Sep. 29, 2016

(30) Foreign Application Priority Data

Mar. 24, 2015 (JP) ................................. 2015-061542

(51) Int. Cl.
*H01H 25/06* (2006.01)
*H03K 17/965* (2006.01)
(Continued)

(52) U.S. Cl.
CPC .......... *H01H 25/065* (2013.01); *H01H 25/06* (2013.01); *H03K 17/965* (2013.01);
(Continued)

(58) Field of Classification Search
CPC ................. H01H 25/06; H01H 25/065; H01H 2025/045; H03K 17/965; H03K 17/975; H03K 2217/94057; H03K 2217/96054
(Continued)

(56) References Cited

U.S. PATENT DOCUMENTS 5,877,463 A 3/1999 Choi
9,241,612 B2 1/2016 Hoshino
(Continued)

FOREIGN PATENT DOCUMENTS

JP 2008152966 A 7/2008
WO 2014/065093 A1 5/2014

OTHER PUBLICATIONS

Official Communication dated Aug. 18, 2016 corresponding to European Patent Application No. EP16161372.4.

*Primary Examiner* — Edwin A. Leon
(74) *Attorney, Agent, or Firm* — Carrier Blackman & Associates, P.C.; William D. Blackman; Jeffrey T. Gedeon

(57) ABSTRACT

A multifunctional selection operation switch apparatus includes: an operation member including multiple operated portions and capable of being rotationally operated, the operated portions being capable of selective contact operation; a rotational displacement detecting device capable of detecting rotational displacement of the operation member; an operation target detecting device capable of detecting on which of the operated portions contact operation is performed; and a controlling device outputting a command signal corresponding to the displacement and the one operated portion, based on detection results of the detecting devices. Accordingly, even if the operation member is a single member, multifunctional selection operation can be performed without difficulty by outputting, whenever necessary, a desired command from multiple operation commands. It is not necessary to mechanically and operatively connect the operation member and the operated portions by a structurally-complicated interlocking mechanism, thereby achieving reduction in the number of parts and cost.

6 Claims, 10 Drawing Sheets

(51) Int. Cl.
 *H03K 17/975* (2006.01)
 *H01H 25/04* (2006.01)
(52) U.S. Cl.
 CPC ..... *H01H 2025/045* (2013.01); *H03K 17/975* (2013.01); *H03K 2217/94057* (2013.01); *H03K 2217/96054* (2013.01)
(58) Field of Classification Search
 USPC ......... 200/5 R, 6 R, 4, 16 R, 14, 16 C, 16 D, 200/17 R
 See application file for complete search history.

(56) References Cited

U.S. PATENT DOCUMENTS

| | | | |
|---|---|---|---|
| 2001/0023816 A1* | 9/2001 | Kuriyama | H01H 25/041 200/6 A |
| 2005/0274591 A1 | 12/2005 | Kim | |
| 2006/0113170 A1* | 6/2006 | Rochon | H01H 25/06 200/5 R |
| 2010/0032266 A1 | 2/2010 | Stephan | |

\* cited by examiner

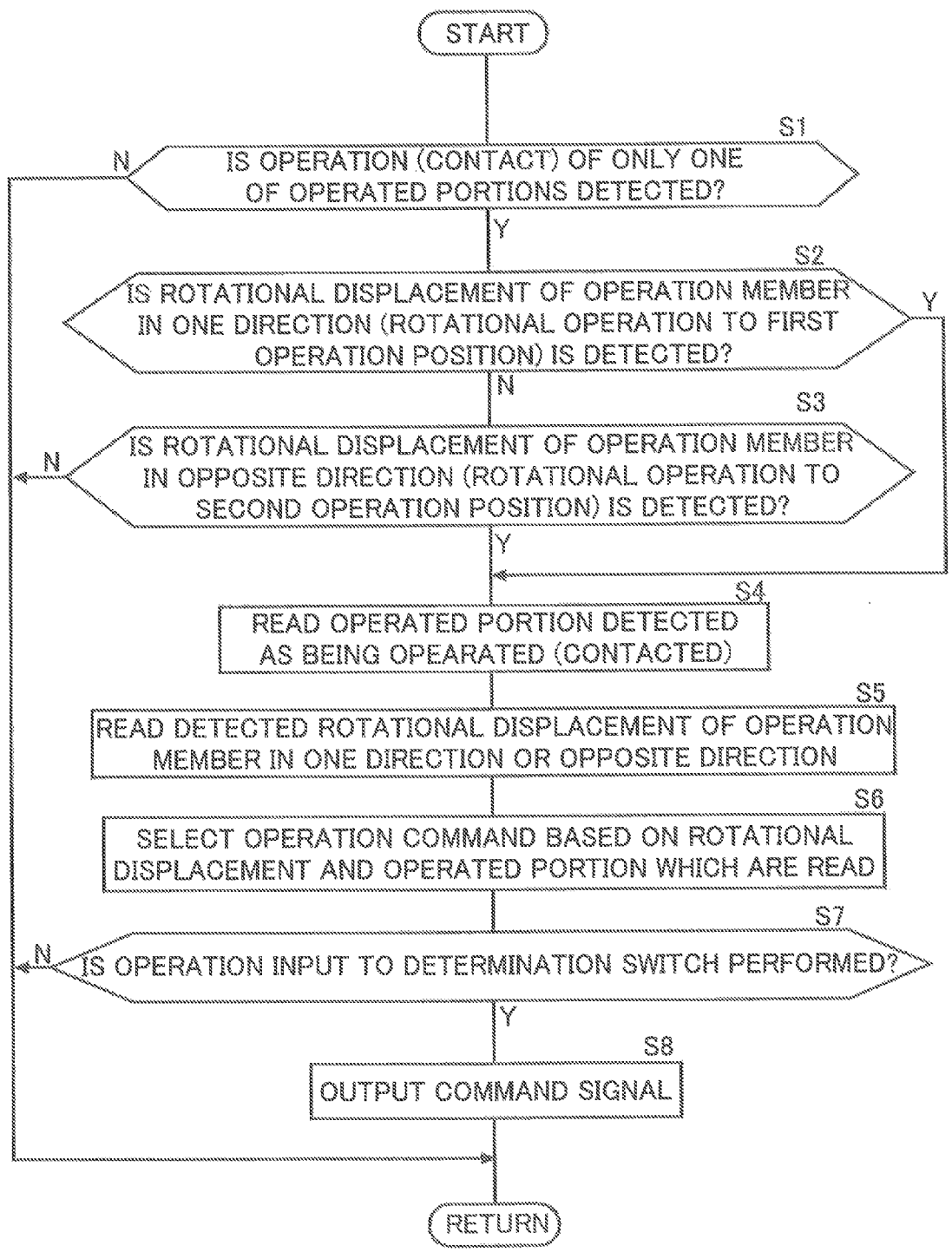

MULTIFUNCTIONAL SELECTION OPERATION SWITCH APPARATUS

BACKGROUND OF THE INVENTION

Field of the Invention

The present invention relates to a multifunctional selection operation switch apparatus capable of, whenever necessary, outputting a desired operation command which is selected from multiple operation commands (that is, performing a multifunctional selection operation) when a single or a small number of operation members are operated.

Description of the Related Art

As such a multifunctional selection operation switch apparatus, for example, International Publication No. WO2014/065093 has made known a switch apparatus enabling multifunctional movement of a tip end portion of an endoscope as an operated member to be controlled by operating a small number of operation knobs.

In the above-mentioned conventional multifunctional selection operation switch apparatus, the operation knobs and the operated member are mechanically and operatively connected to each other via an interlocking mechanism for operatively connecting them in order for multifunctional complicated movement of the operated member to be controlled by the small number of operation knobs. For this reason, there is a problem that a structure of the interlocking mechanism becomes complicated and costs accordingly increase. Moreover, there are problems, for example, that: as the movement of the operated member becomes more multifunctional, the structure of the interlocking mechanism becomes more complicated; and an operation space for operating the operation knobs also becomes larger.

SUMMARY OF THE INVENTION

The present invention has been made with the foregoing situation taken into consideration. An object of the present invention is to provide a multifunctional selection operation switch apparatus which can solve the above-described technical problems using a simple structure.

In order to achieve the object, according to a first aspect of the present invention, there is provided a multifunctional selection operation switch apparatus comprising at least: an operation member including a plurality of operated portions and capable of being rotationally operated, the operated portions being capable of selective contact operation; a rotational displacement detecting device capable of detecting rotational displacement of the operation member; an operation target detecting device capable of detecting on which of the plurality of operated portions contact operation is performed; and a controlling device for selecting and outputting a command signal corresponding to the rotational displacement and one of the operated portions on which the contact operation is performed, based on detection results of the rotational displacement detecting device and the operation target detecting device.

According to the first aspect, when an operator rotationally operates the operation member while performing contact operation on one of the multiple operated portions included in the operation member, the rotational displacement detecting device detects the rotational displacement of the operation member at this time; the operation target detecting device detects on which of the operated portions the contact operation is performed; and based on these detection results, the controlling device outputs the command signal corresponding to the rotational displacement of the operation member and the operated portion on which the contact operation is performed. For this reason, even though the operation member is a single member, multifunctional selection operation can be performed without difficulty. Furthermore, it is not necessary to mechanically and operatively connect the operation member and the operated portions to each other by a structurally-complicated interlocking mechanism, and this makes great contributions to reduction in the number of parts and reduction in costs. Moreover, the operation member is provided with the multiple operated portions all together, and mutually-different operation commands can be assigned respectively to the operated portions. For this reason, an operation space for operating the operation member also can be reduced in size as much as possible.

It should be noted that performing "contact operation" of an operated portion in the present invention and specification includes not only an action of touching the operated portion by hand, but also an action of pinching, pushing and pulling the operated portion by hand.

According to a second aspect of the present invention, in addition to the first aspect, the controlling device stores a plurality of kinds of operation commands which are set in advance corresponding to combination patterns of the rotational displacement of the operation member and the operated portions on which the contact operation is performed, selects an operation command to be outputted from the controlling device based on the stored information, and the detection results of the rotational displacement detecting device and the operation target detecting device, and outputs the command signal corresponding to the operation command.

According to the second aspect, the controlling device stores the plurality of kinds of operation commands which are set in advance corresponding to the combination patterns of the rotational displacement of the operation member and the operated portions on which the contact operation is performed, the controlling device selecting the operation command to be outputted from the controlling device based on the stored information, and the detection results of the rotational displacement detecting device and the operation target detecting device, and the controlling device outputting the command signal corresponding to the operation command. For this reason, even though the operation member is a single member, the controlling device is capable of accurately outputting multiple command signals for selectively performing the multiple functions, based on the combination patterns of the multiple operated portions of the operation member and the rotational displacement of the operation member.

According to a third aspect of the present invention, in addition to the first or second aspect, the operation member is provided to a support body so as to be capable of being rotationally operated between a first operation position on one side in a rotational direction and a second operation position on an opposite side in the rotational direction with a neutral position interposed therebetween.

According to the third aspect, the operation member is provided to the support body so as to be capable of being rotationally operated between the first operation position on the one side in the rotational direction and the second operation position on the opposite side in the rotational direction with the neutral position interposed therebetween. For this reason, attributes of the operation commands respectively assigned to the operated portions can be assigned while classified into two categories in association with the rotational operation of the operation member in one direction and in the opposite direction. Thereby, multifunctional selection operation can be simplified as much as possible, and the number of operation commands can be increased without difficulty while enhancing operability.

According to a fourth aspect of the present invention, in addition to the first or second aspect, the operation member is provided with the plurality of operated portions such that rotational operation force can be transmitted from an operator's hand to the operation member via each of the operated portions.

According to the fourth aspect, the operation member is provided with the plurality of operated portions such that the rotational operation force can be transmitted from the operator's hand to the operation member via each of the operated portions. For this reason, the multiple operated portions for function selection of the switch apparatus also serve as operation knob means for rotationally operating the operation member. Accordingly, a structure of the operation member can be simplified; reduction in costs can be achieved; and the operability can be enhanced.

According to a fifth aspect of the present invention, in addition to the first or second aspect, there is provided the multifunctional selection operation switch apparatus, further comprising a determination switch for arbitrarily determining selection of the operation command by the controlling device, wherein the controlling device outputs the command signal in response to an operation input into the determination switch after the selection of the operation command.

According to the fifth aspect, the multifunctional selection operation switch apparatus further comprises the determination switch for arbitrarily determining selection of the operation command by the controlling device, and the controlling device outputs the command signal in response to the operation input into the determination switch after the selection of the operation command. For this reason, after the selection of the operation command, the controlling device waits until the operation input into the determination switch is performed before outputting the command signal. This is effective to prevent wrong operation.

The above and other objects, characteristics and advantages of the present invention will be clear from detailed descriptions of the preferred embodiment which will be provided below while referring to the attached drawings.

BRIEF DESCRIPTION OF THE DRAWINGS

FIG. 10 is a flow chart showing an example of control of the multifunctional selection operation switch apparatus.

DESCRIPTION OF THE PREFERRED EMBODIMENT

An embodiment of the present invention will be hereinbelow described based on the attached drawings.

Figure 1:
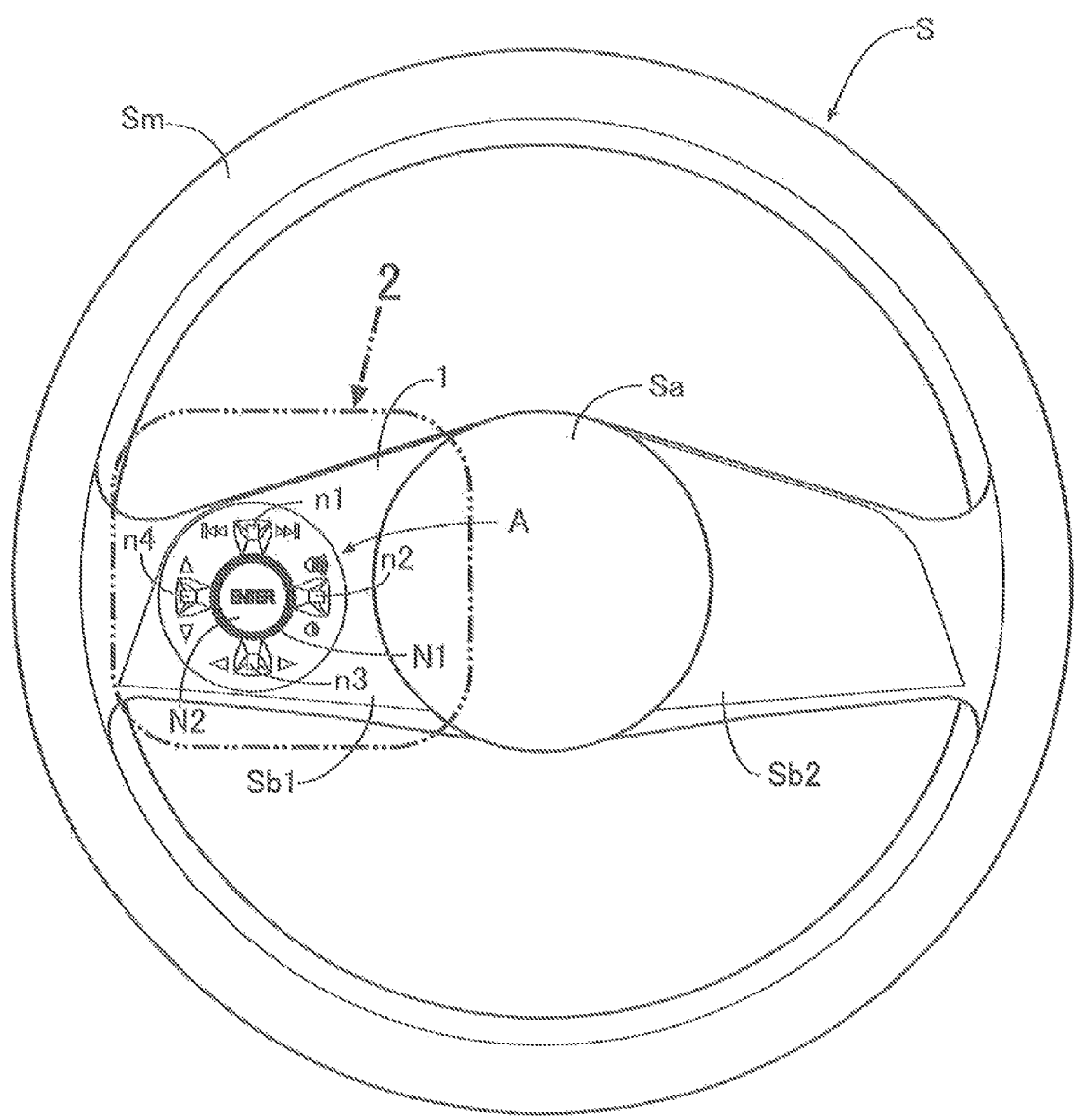
FIG. 1 is an elevation view showing an example of a steering handle in which a multifunctional selection operation switch apparatus of an embodiment of the present invention is incorporated.
Figure 2:
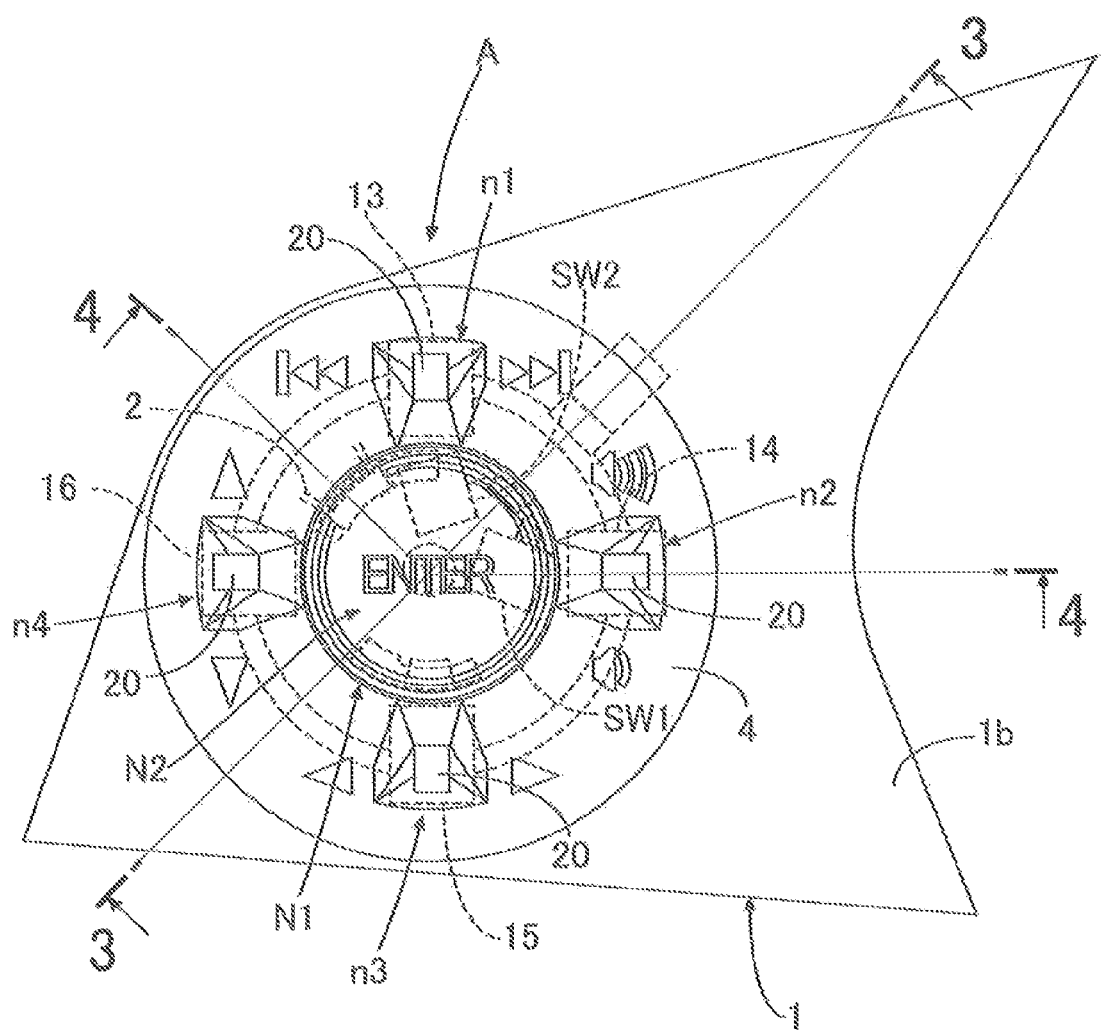
FIG. 2 is an enlarged elevation view of the multifunctional selection operation switch apparatus (an enlarged view of a portion indicated by an arrow 4 in FIG. 1).
Figure 3:
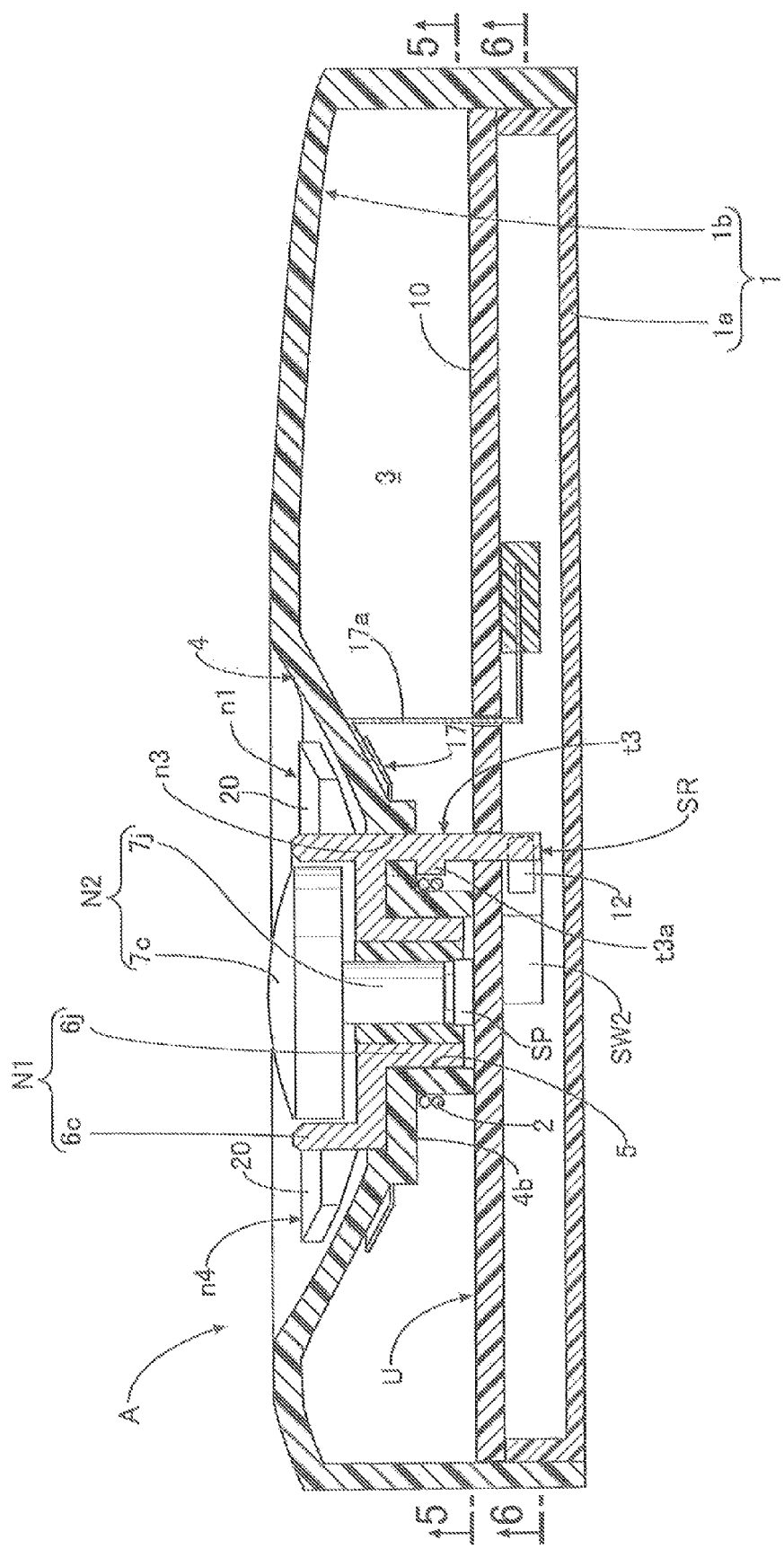
FIG. 3 is an enlarged sectional view taken along a line 3-3 in FIG. 2.
Figure 4:
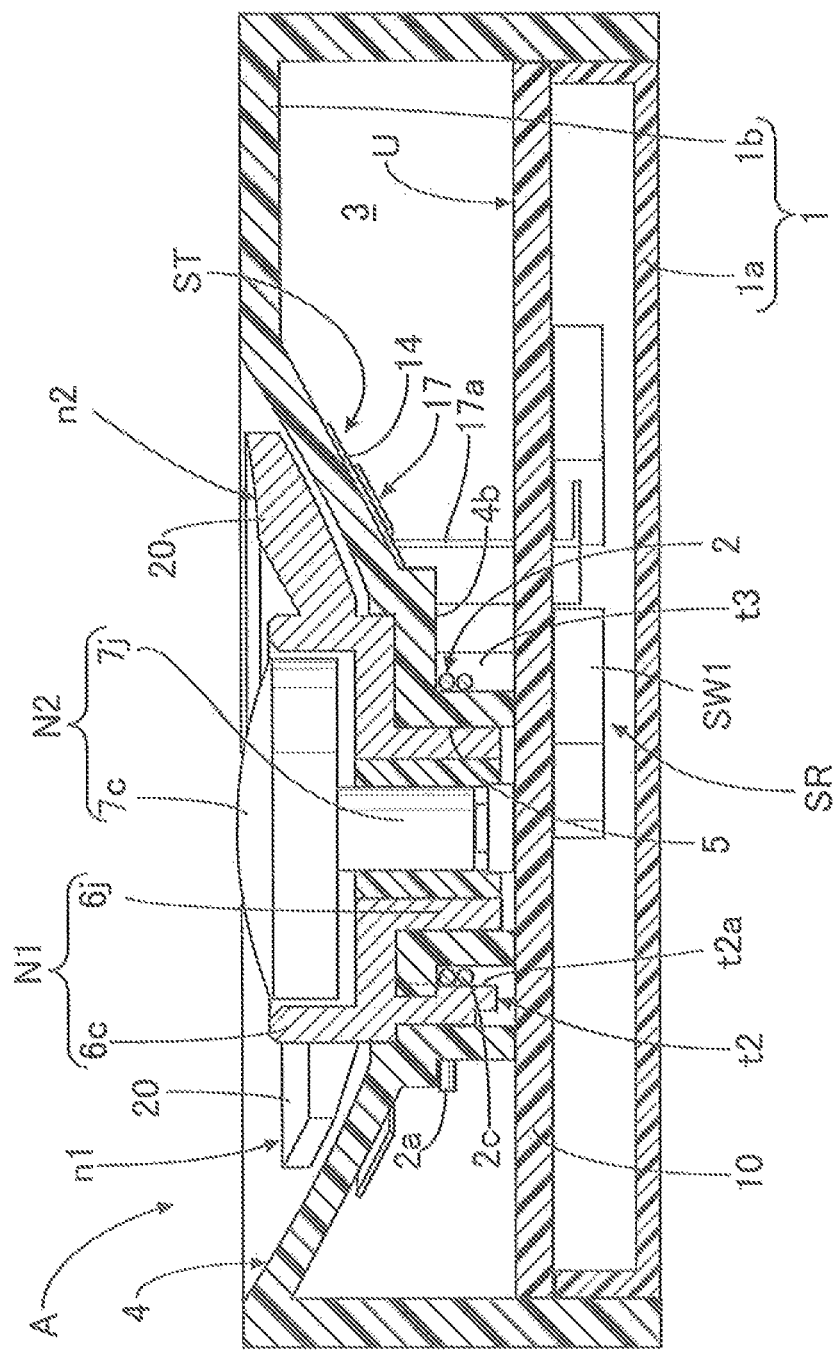
FIG. 4 is an enlarged sectional view taken along a line 4-4 in FIG. 2.
Figure 5:
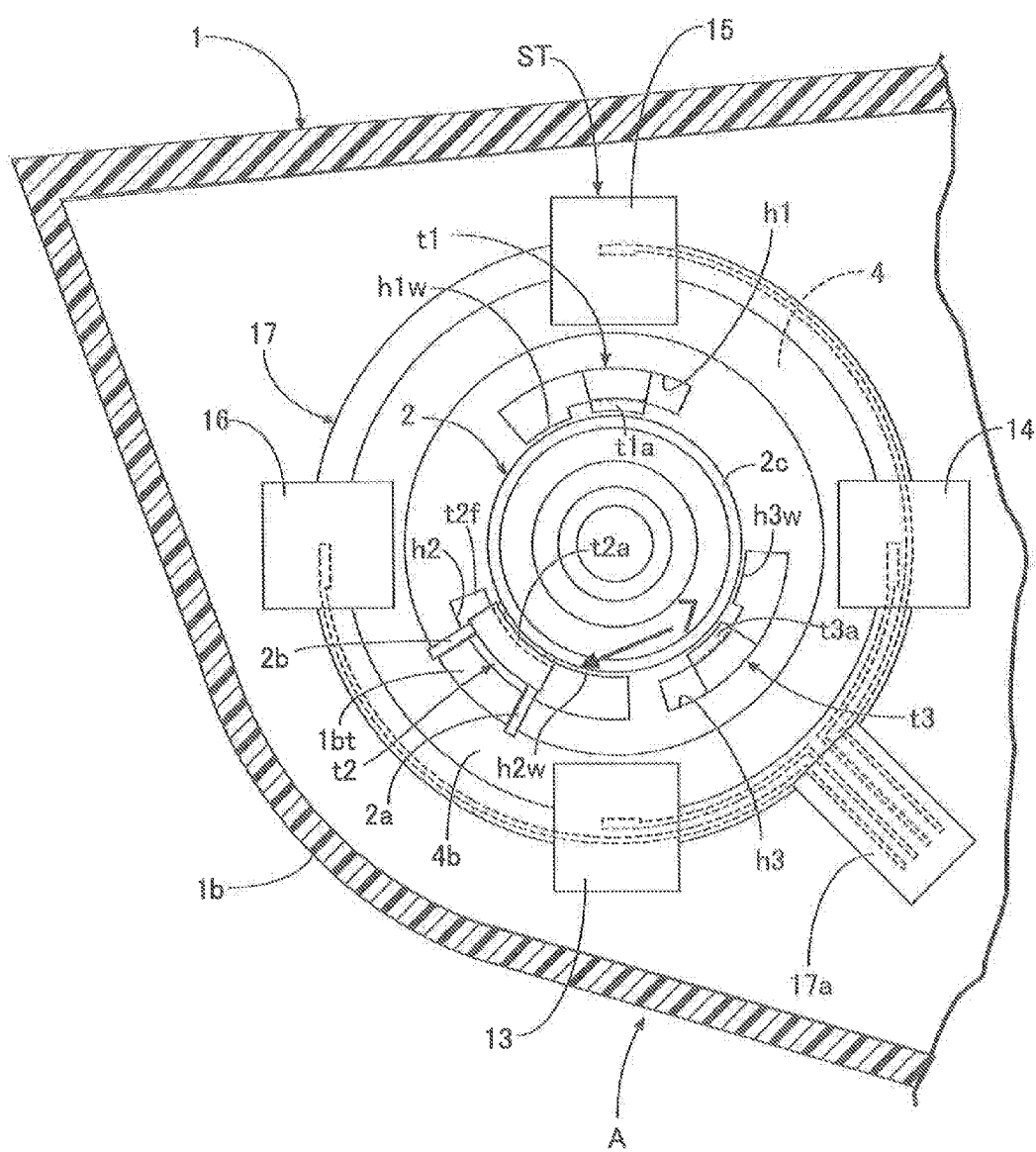
FIG. 5 is a sectional view taken along a line 5-5 in FIG. 3.
Figure 6:
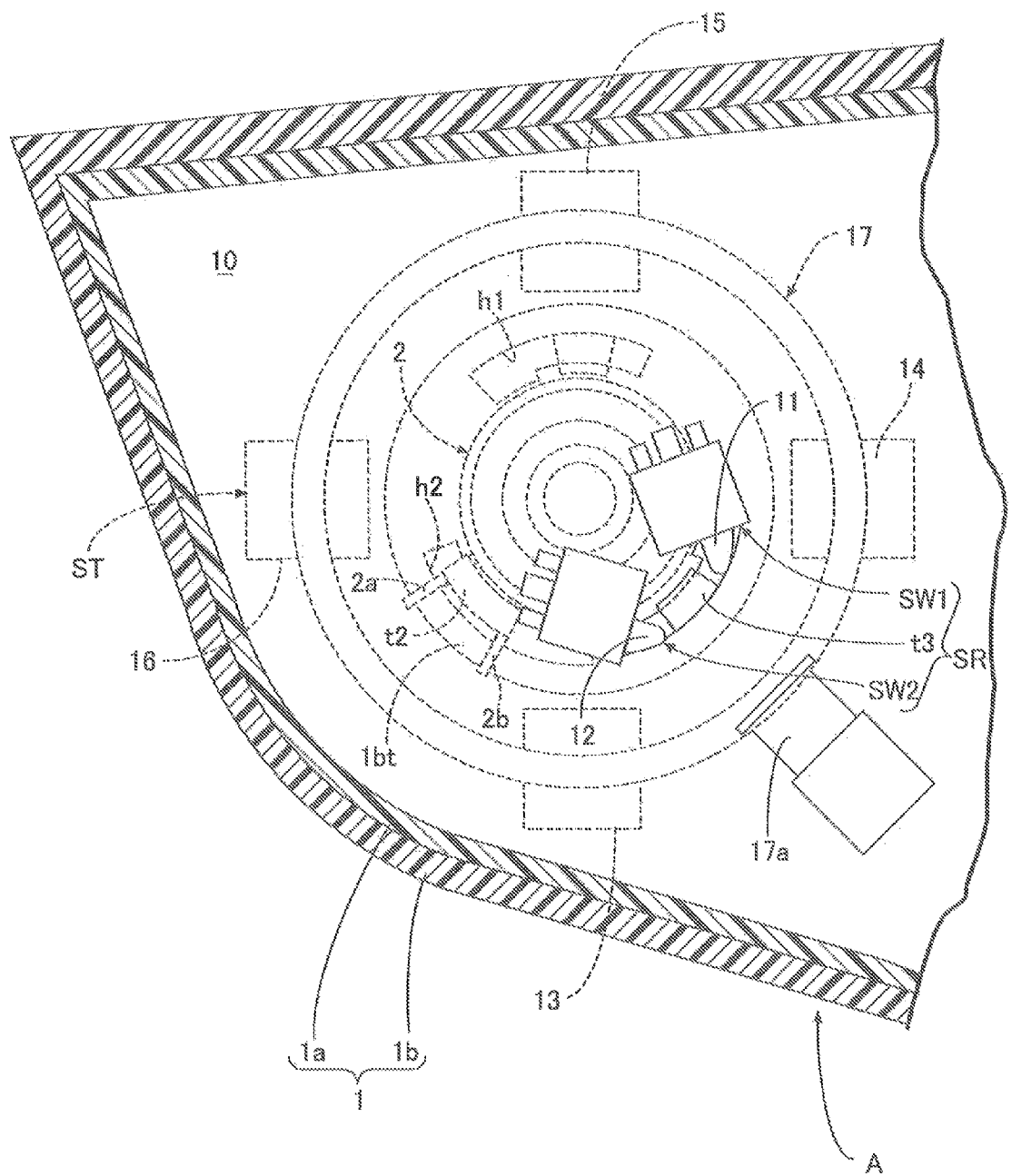
FIG. 6 is a sectional view taken along a line 6-6 in FIG. 3.
Figure 7:
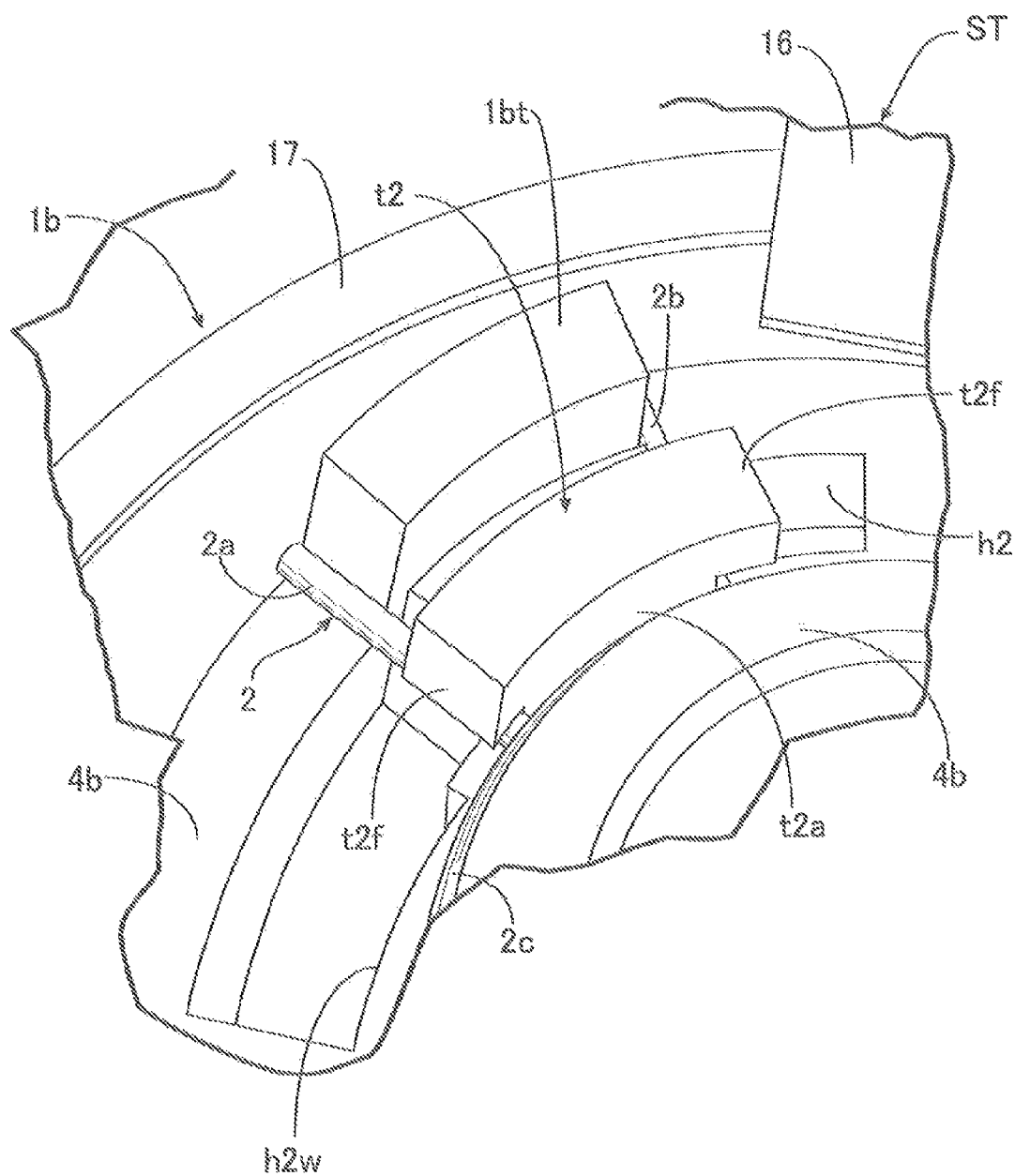
FIG. 7 is an enlarged perspective view as seen in a direction of an arrow 7 in FIG. 5.
Figure 8:
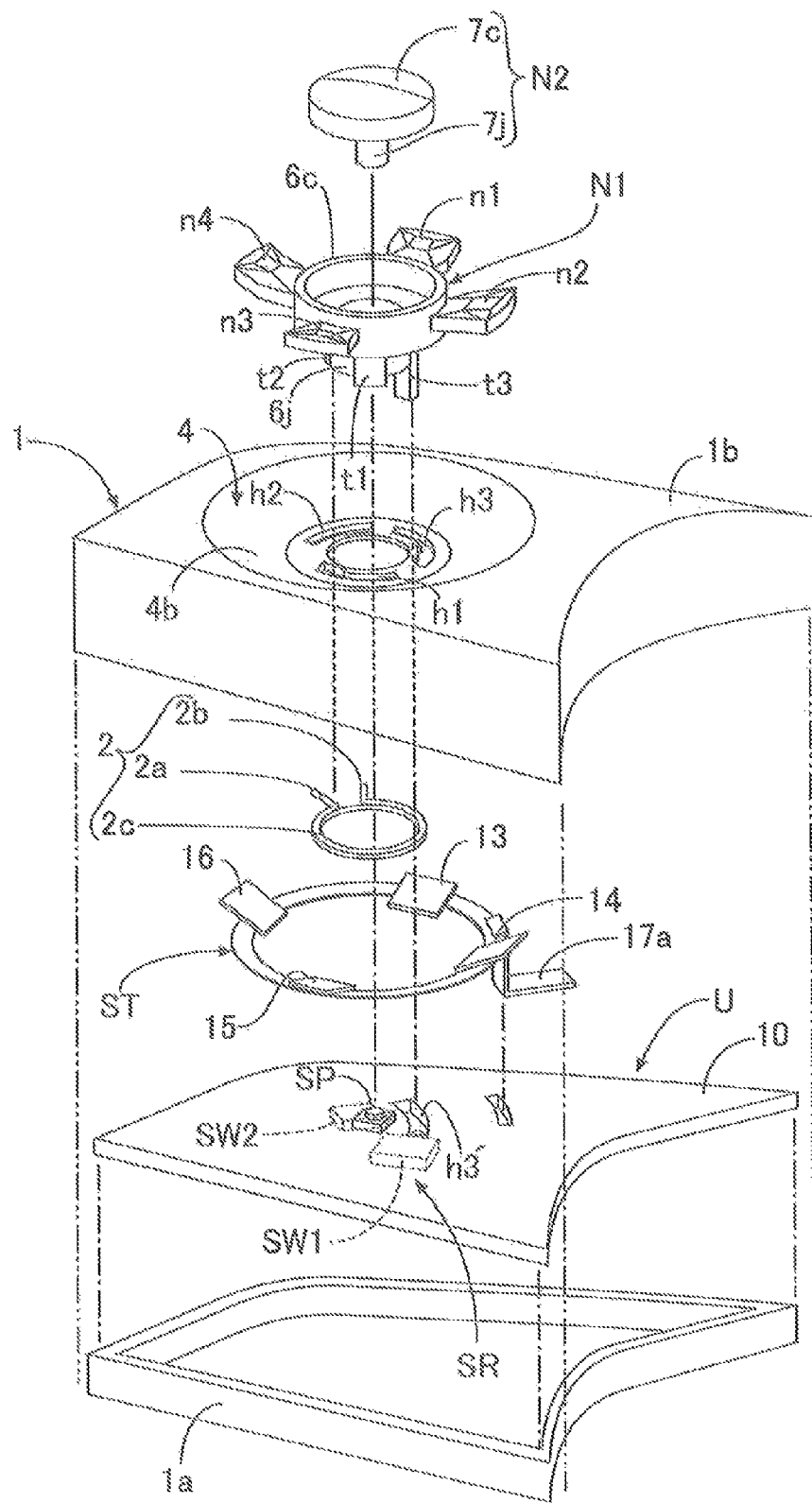
FIG. 8 is an exploded perspective view of the multifunctional selection operation switch apparatus.
Figure 9:
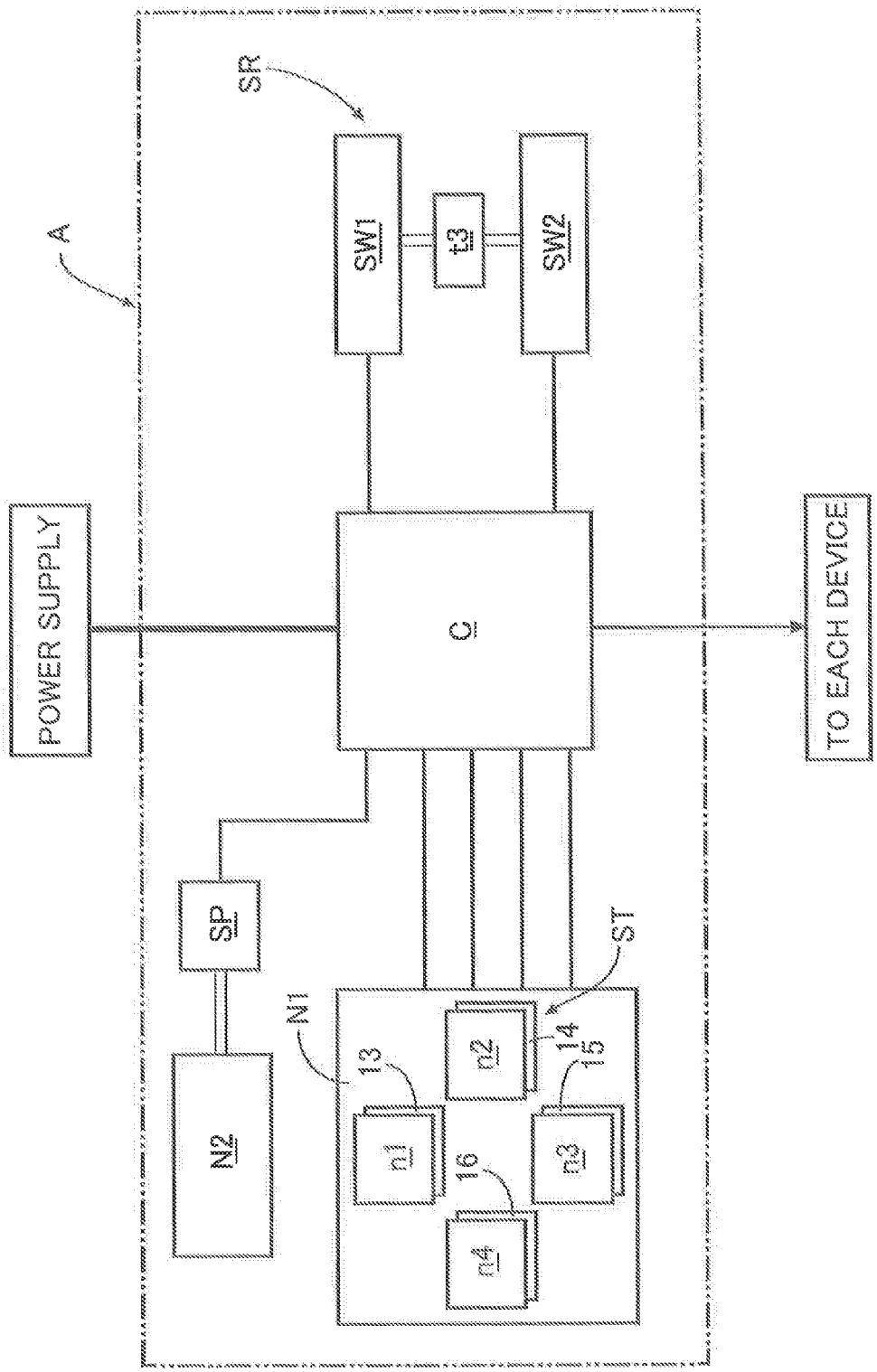
FIG. 9 is a control block diagram of the multifunctional selection operation switch apparatus.

First of all, in FIG. 1, on a front side of a driver's seat in a vehicle compartment of an automobile, a steering handle S is rotatably and operably arranged between the driver's seat and an instrument panel which is not illustrated. The instrument panel is provided with: various instruments such as a speedometer and the like; display parts for in-vehicle equipments such as an audio device, a video device, a car navigation device and the like; an operation part for manually operating the in-vehicle equipments; and the like.

Furthermore, the steering handle S includes: a central hub portion Sa connected to a steering shaft; a grip portion Sm circularly surrounding the central hub portion Sa; a pair of left and right spoke portions Sb1, Sb2 connecting the grip portion Sm and the central hub portion Sa. The operation part of a multifunctional selection operation switch apparatus A of the present invention is disposed in the spoke portion Sb1 which is one of the pair of left and right spoke portions Sb1, Sb2.

Next, referring to FIGS. 2 to 9 together, descriptions will be provided for an embodiment of the multifunctional selection operation switch apparatus A. The operation part of the multifunctional selection operation switch apparatus A includes: a rotationally operable first operation member N1 including multiple operated portions n1 to n4 on which an operator, that is, a driver can perform selective contact operation by hand; a casing 1 supporting the first operation member N1 such that the first operation member N1 can be rotationally operated so as to be able to be rotationally displaced between a first operation position on one side in a rotational direction (on a right side in the illustrated example) and a second operation position in the opposite side in the rotational direction (on a left side in the illustrated example) with a predetermined neutral position interposed therebetween; a return spring 2 provided inside the casing 1 and capable of elastically retaining the first operation member N1 at the neutral position; and a second operation member N2 capable of arbitrarily performing operation input into a determination switch SP configured to determine the selection of an operation command whenever necessary, as described later.

The casing 1 is divided into a dish-shaped base plate 1a, and an upper case 1b connected onto the base plate 1a and defining a switch containing chamber 3 between the upper case 1b and the base plate 1a. An upper surface of the upper case 1b forms a part of a surface of the spoke portion Sb1. A mortar-shaped recessed portion 4 which is recessed from the upper surface of the upper case 1b is formed in the upper case 1b. In a central portion of a bottom wall 4b of the recessed portion 4, a through-hole 5 passing through the central portion in an up-down direction is formed. Furthermore, inside the switch containing chamber 3, an electronic substrate 10 is fixed onto the base plate 1a.

The first operation member N1 integrally includes: a hollow shaft portion 6j rotatably fitted and supported in the through-hole 5; and an expanded head portion 6c connected to an upper end of the hollow shaft portion 6j, and housed in the recessed portion 4. The expanded head portion 6c is formed in a bottomed cylindrical shape having an opened upper end. In addition, first to third engagement projections t1 to t3 extending downward in an axial direction are integrally projected from a lower surface of a bottom wall of the expanded head portion 6c at intervals in a peripheral direction. Meanwhile, multiple arc-shaped long holes h1 to h3 in which the engagement projections t1 to t3 are slidably fitted are formed in the bottom wall 4b of the recessed portion 4 of the upper case 1b so as to be along an outer periphery of the through-hole 5.

Furthermore, particularly the first to third engagement projections t1 to t3 integrally include retaining claw portions t1a to t3a provided to respective portions of the first to third engagement projections t1 to t3 extending downward of the bottom wall 4b. Meanwhile, the arc-shaped long holes h1 to h3 in which the first to third engagement projections t1 to t3 are fitted include wide portions h1w to h3w allowing the retaining claw portions t1a to t3a to pass through the wide portions h1w to h3w. For this reason, when the first operation member N1 is rotated relative to the casing 1 (accordingly, the first to third engagement projections t1 to t3 are slid inside the arc-shaped long holes h1 to h3) after the retaining claw portions t1a to t3a are passed through the wide portions h1w to h3w, the retaining claw portions t1a to t3a are engaged with inner edges of the arc-shaped long holes h1 to h3, and the first operation member N1 is retained not to come off the upper case 1b. In other words, the first to third engagement projections t1 to t3 and the arc-shaped long holes h1 to h3 form, in cooperation with each other, a bayonet mechanism for detachably retaining the first operation member N1 in order for the first operation member N1 not to come off the casing 1.

Moreover, particularly the third engagement projection t3 is formed downward longer than the first and second engagement projections t1, t2. A lower end portion of the third engagement projection t3 passes through an arc-shaped long hole h3' and extends downward of the arc-shaped long hole h3', the long hole h3' being provided in the electronic substrate 10 so as to correspond to the arc-shaped long hole h3. In cooperation with a pair of operation position detection switches SW1, SW2 provided on a lower surface of the electronic substrate 10, the lower end portion of the third engagement projection t3 functions as rotational displacement detecting means SR of the present invention, as described later.

In addition, a coil portion 2c of the return spring 2 made of a torsion coil spring is wound around an outer periphery of the hollow shaft portion 6j. One terminal 2a and an opposite terminal 2b of the coil portion 2c which extend outward in a radial direction are arranged side-by-side at a certain interval in positions close to each other in a peripheral direction of the coil portion 2c. A support projection 1bt integrally formed with the upper case 1b, and the second engagement projection t2 formed to have substantially the same width in the peripheral direction as the support projection 1bt are clamped between the terminals 2a, 2b of the return spring 2 so as to be in parallel with each other. Incidentally, a spring receiving flange portion t2f is connected to a lower end portion of the second engagement projection t2, the spring receiving flange portion t2f being engaged with the terminals 2a, 2b of the return spring 2 at opposite ends in the peripheral direction of the lower end portion of the second engagement projection t2. For this reason, while the first operation member N1 is in a free condition, that is, in a non-operated condition, the second engagement projection t2 of the first operation member N1 is retained by elastic force of the return spring 2 at a predetermined position aligned with the support projection 1bt. Thereby, the first operation member N1 can be elastically retained at the predetermined neutral position. Furthermore, rotational operation of the first operation member N1 from this neutral position in one direction or an opposite direction is performed against the elastic force of the return spring 2. When the rotational operation force is released, the first operation member N1 automatically returns to the neutral position due to the elastic force of the return spring 2.

Besides, the first to fourth operated portions n1 to n4 extending radially inside the recessed portion 4 of the upper case 1b are integrally projected from an outer peripheral portion of the expanded head portion 6c of the first operation member N1. Upper surfaces of the operated portions n1 to n4 are each provided with convexoconcave 20 for making it easy to press the operator's finger onto each of the upper surfaces and for easily applying friction force between the upper surface and the operator's finger. Accordingly, the operator can perform selective contact operation (pressing operation, in the illustrated example) on the upper surfaces of the operated portions n1 to n4 with the finger. Furthermore, in the contact operation, the convexoconcave 20 makes it easy to perform pushing and rotating operation of the first operation member N1 via each of the operated portions n1 to n4. Thus, the first operation member N1 has a structure capable of transmitting the rotational operation force from the operator's hand to the first operation member N1 side via each of the operated portions n1 to n4 on which selective contact operation is performed.

In addition, the second operation member N2 integrally includes: a shaft portion 7j vertically slidably fitted and supported on an inner periphery of the hollow shaft portion 6j of the first operation member N1 via a guide sleeve; and a disk-shaped expanded head portion 7c connected to an upper end of the shaft portion 7j, and housed in the expanded head portion 6c of the first operation member N1. A driven section of the determination switch SP set and fixed on the electronic substrate 10 is operatively connected to a lower end of the shaft portion 7j. Incidentally, the determination switch SP is use for arbitrarily determining the selection of an operation command by an electronic control unit U as described later. In the illustrated example, the determination switch SP is put into an ON operation condition only when an upper surface of the expanded head portion 7c of the second operation member N2 is pressed down, while the determination switch SP returns to an OFF operation condition when the operator stops the press-down operation of the second operation member N2.

Meanwhile, the multifunctional selection operation switch apparatus A includes: the rotational displacement detecting means SR placed inside the casing 1 and capable of detecting the rotational displacement of the first operation member N1; the operation target detecting means ST placed inside the casing 1 and capable of detecting on which of the multiple operated portions n1 to n4 contact operation is performed; and the electronic control unit U as controlling means, connected to the rotational displacement detecting means SR and the operation target detecting means ST, and outputting a command signal corresponding to the rotational displacement and the one of the operated portions n1 to n4 on which the contact operation is performed, based on respective detection results of the detecting means SR, ST.

In the illustrated example, the rotational displacement detecting means SR is formed from: the lower end portion of the third engagement projection t3 integral with the first operation member N1, the lower end portion extending downward of the electronic substrate 10; and the pair of operation position detection switches SW1, SW2 set and fixed on the lower surface of the electronic substrate 10 so as to interpose the lower end portion between the operation position detection switches SW1, SW2. Moreover, when the first operation member N1 is operated to rotate from the neutral position to the first operation position on the one side in the rotational direction, the lower end portion of the third engagement projection t3 rotating integrally with the first operation member N1 engages with an engaged portion 11 spring-biased in an overhanging direction and pushes in the engaged portion 11. Thereby, the first switch SW1 outputs a detection signal to the electronic substrate 10. Further, when the first operation member N1 is operated to rotate from the neutral position to the second operation position on the opposite side in the rotational direction, the lower end portion of the third engagement projection t3 rotating integrally with the first operation member N1 engages with an engaged portion 12 spring-biased in an overhanging direction and pushes in the engaged portion 12. Thereby, the second switch SW2 outputs a detection signal to the electronic substrate 10. Thereafter, in response to the return of the first operation member N1 to the neutral position, the lower end portion of the third engagement projection t3 separates from the engaged portions 11, 12 of the operation position detection switches SW1, SW2, thereby stopping the output of the detection signal.

Furthermore, the operation target detecting means ST is formed from multiple electrostatic capacity detection sensors 13 to 16 respectively corresponding to the multiple operated portions n1 to n4 of the first operation member N1 and joined to an inner wall of the upper case 1b (a lower wall of the mortar-shaped recessed portion 4 in the illustrated example). The electrostatic capacity detection sensors 13 to 16 are configured to be capable of distinguishing between a contacted state and a non-contacted state of the operator's finger on the corresponding operated portions n1 to n4 from a change of electrostatic capacity. The electrostatic capacity detection sensors 13 to 16 are attached to the inner wall of the upper case 1b via a support ring 17 supporting the electrostatic capacity detection sensors 13 to 16 integrally with one another. A terminal portion 17a connected to the electronic substrate 10 is connectedly provided to the support ring 17. Signal lines extending respectively from the electrostatic capacity detection sensors 13 to 16 are connected to the terminal portion 17a by passing through an inside of the support ring 17. A detection signal from each of the electrostatic capacity detection sensors 13 to 16 is outputted to the electronic substrate 10.

In the illustrated example, the electronic control unit U is formed from: the electronic substrate 10 inside the casing 1; and a number of circuit elements (not illustrated) such as arithmetic elements, memory elements and the like which are set on the electronic substrate 10. Incidentally, the electronic control unit U may be disposed at a place independent from the casing 1, that is, at a place in a vehicle body outside the casing 1 (for example, on the back side of the instrument panel, inside an engine room, and the like).

Thus, the electronic control unit U includes at least: a signal input section for receiving an output signal from the determination switch SP and detection signals from the rotational displacement detecting means SR and the operation target detecting means ST; a storage section for storing multiple kinds of operation commands which are set in advance corresponding to combination patterns of the rotational displacement of the first operation member N1 and each of the operated portions n1 to n4 on which selective contact operation is performed by the operator's hand; an arithmetic section for selecting an operation command to be outputted based on the information stored in the storage section and the detection results of the rotational displacement detecting means SR and the operation target detecting means ST; and a signal output section for outputting the command signal corresponding to the operation command selected by the arithmetic section.

The above-mentioned multiple kinds of operation commands are appropriately selected from operation commands for operating at any time the in-vehicle equipments such as the audio device, the video device, the car navigation device and the like. Examples of the multiple kinds of operation commands in the embodiment are as follows. Operation commands for enlarging and reducing the size of a car navigation map on the display part in the instrument panel are outputted in response to the detection of contact on the first operated portion n1 on the upper side and the detection of rightward and leftward rotational displacement of the first operation member N1. Operation commands for turning the volume up and down are outputted in response to the detection of contact on the second operated portion n2 on the right side and the detection of rightward and leftward rotational displacement of the first operation member N1. In addition, operation commands for making contents go leftward and rightward on the display part in the instrument panel are outputted in response to the detection of contact on the third operated portion n3 on the lower side and the detection of rightward and leftward rotational displacement of the first operation member N1. Furthermore, operation commands for making a list go upward and downward on the display part in the instrument panel are outputted in response to the detection of contact on the fourth operated portion n4 on the left side and the detection of rightward and leftward rotational displacement of the first operation member N1.

Moreover, corresponding to attributes of the operation commands based on the operated portions n1 to n4, pictograms (see FIGS. 1 and 2) representing the attributes are appropriately provided to the recessed portion 4 of the upper case 1b of the casing 1 in order to clarify what a functional operation is selected by each of the operated portions n1 to n4.

It should be noted that the electronic control unit U may be the controlling means exclusive for the multifunctional selection operation switch apparatus A. Otherwise, the electronic control unit U may be controlling means also usable to control other in-vehicle electronic equipments.

Next, descriptions will be provided for an operation of the embodiment. FIG. 10 shows a flow chart representing an example of a control flow of the multifunctional selection operation switch apparatus A which is performed based on the operation of the electronic control unit U.

When an accessory power supply switch (ACC) not illustrated, of the automobile is turned on, the electronic control unit U is put into an operable standby condition. In the standby condition, first of all, in step S1, it is judged whether or not contact operation (pressing operation in the illustrated example) is performed on only one of the multiple operated portions n1 to n4 of the first operation member N1, based on the detection result of the operation target detecting means ST. If the judgment is negative (that is, when contact operation is not performed on any of the operated portions n1 to n4, or when contact operation is simultaneously performed on two or more of the operated portions n1 to n4), the control flow returns.

Meanwhile, if it is judged in step S1 that contact operation is performed on only one of the multiple operated portions n1 to n4, the control flow proceeds to step S2, where it is judged whether or not the first operation member N1 is in the first operation position by being rotationally displaced in one direction (rightward in the illustrated example) based on the detection result of the rotational displacement detecting means SR. If the judgment is negative, the control flow proceeds to step S3, where it is judged whether or not the first operation member N1 is in the second operation position by being rotationally displaced in the opposite direction (leftward in the illustrated example). If the judgement is negative, the control flow returns. On the other hand, if the judgment is not negative, the control flow proceeds to step S4.

Furthermore, in step S2, if the judgment is not negative (that is, if it is judged that the first operation member N1 is in the first operation position by being rotationally displaced in the one direction), the control flow proceeds to step S4 by skipping step S3.

In step S4, the electronic control unit U reads information of the one of the operated portions n1 to n4, contact operation of which has been detected in step S1. Thereafter, the control flow proceeds to step S5. In step S5, the electronic control unit U reads information of the rotational displacement of the first operation member N1 in the one direction or the opposite direction (that is, the rotational operation of the first operation member N1 to the first or second operation position) based on the detection result of the rotational displacement detecting means SR. Subsequently, the control flow proceeds to step S6.

In step S6, the electronic control unit U selects an operation command based on the information read in step S4 (that is, the one of the operated portions n1 to n4, the contact operation of which has been detected) and the information read in step S5 (that is, the rotational displacement of the first operation member N1 in the one direction or the opposite direction). Thereafter, the control flow proceeds to step S7. The above-described selection is performed by comparing a combination pattern of the one of the operated portions n1 to n4 and the rotational displacement which are read, with a correspondence map between the combination patterns of the operated portions n1 to n4 and the rotational displacement, and the operation commands, the correspondence map being beforehand stored in the electronic control unit U. Thereafter, the selection result of the operation command in step S6 is retained unless the information read in step S4 and step S5 are changed by being overwritten.

In step S7, it is judged whether or not press-down operation on the second operation member N2 is performed, that is, whether or not the determination switch SP is turned on by the press-down operation. If it is judged that the determination switch SP is turned on, the control flow proceeds to step S8. If it is judged that the determination switch SP is not turned on, the control flow returns.

In step S8, a command signal corresponding to the operation command selected in step S6 is outputted to the in-vehicle equipment such as the audio device, the video device, the car navigation device and the like, which is to be operated based on the command signal. In other words, the selection result of the operation command in step S6 is determined by the operation input into the determination switch SP. Thereby, the operation command is outputted.

According to the above-described multifunctional selection operation switch apparatus A of the embodiment, in a state where the operator's finger is in contact with one of the multiple operated portions n1 to n4 of the first operation member N1, when the operator rotationally operates the first operation member N1 either leftward or rightward via the one of the multiple operated portions n1 to n4, the rotational displacement detecting means SR detects the rotational displacement of the first operation member N1 at this time, and the operation target detecting means ST detects on which of the operated portions n1 to n4 the contact operation is performed. Thereby, based on the detection results, the electronic control unit U outputs the command signal corresponding to the rotational displacement of the first operation member N1 and the one of the operated portions n1 to n4 on which the contact operation is performed. For this reason, even though the first operation member N1 is a single member, the multifunctional selection operation can be performed without difficulty.

Moreover, since it is not necessary to mechanically and operatively connect the first operation member N1 and the in-vehicle equipments which are to be operated based on the respective operation commands, by a structurally-complicated interlocking mechanism, reduction in the number of parts and reduction in costs can be achieved. In addition, since the first operation member N1 is provided with the multiple operated portions n1 to n4 which are aligned in the peripheral direction of the first operation member N1, and since mutually-different operation commands can be assigned respectively to the operated portions n1 to n4, an operation space for operating the first operation member N1 also can be reduced in size as much as possible.

Besides, in the embodiment, the electronic control unit U is such that: the storage section stores the multiple kinds of operation commands which are set in advance corresponding to the combination patterns of the rotational displacement of the first operation member N1 and each of the operated portions n1 to n4 on which the contact operation is performed; the arithmetic section calculates and selects the operation command which is to be outputted from the electronic control unit U based on the information stored in the storage section, and the detection results of the rotational displacement detecting means SR and the operation target detecting means ST; and the signal output section is capable of outputting the command signal corresponding to the operation command. For this reason, even though the first operation member N1 is a single member, the electronic control unit U is capable of accurately outputting multiple command signals for selectively performing the multiple functions, based on the combination patterns of the multiple operated portions n1 to n4 of the first operation member N1 and the rotational displacement of the first operation member N1.

In addition, particularly in the embodiment, the first operation member N1 is provided to the casing 1 as a support body such that the first operation member N1 can be rotationally operated between the first operation position on the one side in the rotational direction and the second operation position on the opposite side in the rotational direction with the neutral position interposed therebetween. For this reason, the attributes of the multiple kinds of operation commands which are respectively assigned to the multiple operated portions n1 to n4 provided to the first operation member N1 can be assigned while classified into two categories corresponding to the leftward and rightward rotation of the first operation member N1. Thereby, the multifunctional selection operation can be simplified as much as possible, and the number of operation commands can be increased without difficulty while enhancing the operability.

Furthermore, in the embodiment, the first operation member N1 is such that the rotational operation force can be transmitted from the operator's finger to the first operation member N1 side via the operated portions n1 to n4 on which selective contact operation is performed. For this reason, the multiple operated portions n1 to n4 for the function selection in the multifunctional selection operation switch apparatus A also serve as operation knob means for rotationally operating the switch. Accordingly, the structure of the first operation member N1 can be simplified, and reduction in costs can be achieved.

Moreover, the embodiment includes the determination switch SP for determining the selection of the operation command by the electronic control unit U (the processing to be performed in step S6) whenever necessary. The electronic control unit U outputs the command signal in response to the operation input into the determination switch SP after the selection of the operation command. In other words, after the selection of the operation command, the electronic control unit U waits until the operation input into the determination switch SP is performed before outputting the command signal. For this reason, the intention of the operator can be more clearly reflected on the outputting of the command signal. This is effective to prevent wrong operation.

Although the embodiment of the present invention has been described above, the present invention is not limited to the foregoing embodiment. Various design changes can be made without departing from the gist of the present invention.

For example, the embodiment shows the example where the operation part of the multifunctional selection operation switch apparatus A is placed in the steering handle S (the spoke portion Sb1). However, the location of the placement of the multifunctional selection operation switch apparatus of the present invention is not limited to that shown in the embodiment. The location of the placement thereof may be a different appropriate location in the vehicle compartment which is reachable by the operator's hand, for example, the instrument panel, a center console and the like.

Furthermore, the multifunctional selection operation switch apparatus of the present invention is applicable to not only automobiles but also various other products, for example, household appliances, consumer electronics, personal computers, medical apparatuses, industrial machines and construction machines, in order to perform the multifunctional selection operation.

Moreover, the embodiment shows the example where the electrostatic capacity detection sensors 13 to 16 are used as the operation target detecting means ST, the electrostatic capacity detection sensors 13 to 16 detecting that the operator's finger is in contact with or approaches the multiple operated portions n1 to n4. However, the operation target detecting means of the present invention is not limited to that shown in the embodiment. Various variations can be made as long as the operation target detecting means is capable of detecting that the operator's hand, for example, his or her finger, is in contact with or approaches the multiple operated portions n1 to n4. Examples of sensors which may be used for the operation target detecting means include: pressure sensors capable of detecting contact pressure on the operated portions n1 to n4; photoelectric sensors, infrared sensors and the like, capable of optically detecting that the operator's finger, for example, is in contact with or approaches the operated portions n1 to n4.

In addition, the operation target detecting means ST may be provided to the first operation member N1 or the casing 1. Furthermore, the operation target detecting means ST may be provided to an outer member of the casing 1, for example, either of the spoke portions Sb1, Sb2 of the steering handle S.

Moreover, the embodiment shows the example where the operation position detection switches SW1, SW2 is used as the rotational displacement detecting means SR, the operation position detection switches SW1, SW2 outputting detection signals to the electronic control unit U, in response to that the first operation member N1 is operated to the first and second operation positions. However, the rotational displacement detecting means of the present invention is not limited to that shown in the embodiment. Various variations can be made. For example, a rotational displacement sensor may be used which measures the amount of rotational displacement of the first operation member N1 and outputs the measurement value to the electronic control unit U.

Besides, the embodiment shows the example where the rotational displacement detecting means SR detects the rotational displacement of the first operation member N1 in the left and right two directions. However, the rotational displacement detecting means may detect the one direction of leftward or rightward rotational displacement of the first operation member N1 in multiple stages.

In addition, the embodiment shows the example where the number of operated portions n1 to n4 placed in the first operation member N1 is four. However, the number of operated portions placed in the first operation member N1 may be larger or smaller than four.

Furthermore, the embodiment shows the example where the determination switch SP is additionally provided to arbitrarily decide (determine) the selection result of the operation command by the electronic control unit U as controlling means (in step S6). However, the determination switch SP may be omitted depending on the necessity. If the determination switch SP may be omitted, the control flow may directly transit from step S6 to step S8 by omitting step S7.

What is claimed is:

1. A multifunctional selection operation switch apparatus comprising at least:
    an operation member configured to be rotationally operated and having a plurality of operated portions configured for selective contact operation;
    a rotational displacement detecting device configured to detect rotational displacement of the operation member;
    an operation target detecting device configured to detect a particular operated portion of the plurality of operated portions on which contact operation is performed; and
    a controller configured to select and output a command signal corresponding to the rotational displacement and the particular operated portion on which contact operation is performed at the same time as the rotational displacement, based on detection results of the rotational displacement detecting device and the operation target detecting device at the same time,
    wherein the operated portions provide knobs for transmitting rotational operation force to the operation member.

2. The multifunctional selection operation switch apparatus according to claim 1, wherein the controller is further configured to
    store a plurality of kinds of operation commands which are set in advance corresponding to combination patterns of the rotational displacement of the operation member and the operated portions on which the contact operation is performed,
    select an operation command to be outputted from the controlling device based on the stored information, and the detection results of the rotational displacement detecting device and the operation target detecting device, and
    output the command signal corresponding to the operation command.

3. The multifunctional selection operation switch apparatus according to claim 1, wherein the operation member is provided to a support body so as to be capable of being rotationally operated between a first operation position on one side in a rotational direction and a second operation position on an opposite side in the rotational direction with a neutral position interposed therebetween.

4. The multifunctional selection operation switch apparatus according to claim 1,
further comprising a determination switch for arbitrarily determining selection of the operation command by the controlling device, wherein
the controller is further configured to output the command signal in response to an operation input into the determination switch after the selection of the operation command.

5. The multifunctional selection operation switch apparatus according to claim 2, wherein
the operation member is provided to a support body so as to be capable of being rotationally operated between a first operation position on one side in a rotational direction and a second operation position on an opposite side in the rotational direction with a neutral position interposed therebetween.

6. The multifunctional selection operation switch apparatus according to claim 2,
further comprising a determination switch for arbitrarily determining selection of the operation command by the controlling device, wherein
the controller is further configured to output the command signal in response to an operation input into the determination switch after the selection of the operation command.

* * * * *